(12) United States Patent
Kub et al.

(10) Patent No.: US 9,099,375 B2
(45) Date of Patent: Aug. 4, 2015

(54) DIAMOND AND DIAMOND COMPOSITE MATERIAL

(71) Applicants: Francis J. Kub, Arnold, MD (US); Charles R. Eddy, Jr., Columbia, MD (US); Boris N. Feygelson, Springfield, VA (US); Scooter Johnson, Hyattsville, MD (US)

(72) Inventors: Francis J. Kub, Arnold, MD (US); Charles R. Eddy, Jr., Columbia, MD (US); Boris N. Feygelson, Springfield, VA (US); Scooter Johnson, Hyattsville, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 107 days.

(21) Appl. No.: 13/899,433

(22) Filed: May 21, 2013

(65) Prior Publication Data
US 2013/0306988 A1    Nov. 21, 2013

Related U.S. Application Data

(60) Provisional application No. 61/649,693, filed on May 21, 2012.

(51) Int. Cl.
| | |
|---|---|
| C23C 24/08 | (2006.01) |
| H01L 29/16 | (2006.01) |
| H01L 21/04 | (2006.01) |
| H01L 21/02 | (2006.01) |

(52) U.S. Cl.
CPC .......... *H01L 29/1602* (2013.01); *C23C 24/082* (2013.01); *H01L 21/0245* (2013.01); *H01L 21/0262* (2013.01); *H01L 21/02444* (2013.01); *H01L 21/02507* (2013.01); *H01L 21/02513* (2013.01); *H01L 21/02527* (2013.01); *H01L 21/02601* (2013.01); *H01L 21/02628* (2013.01); *H01L 21/0405* (2013.01)

(58) Field of Classification Search
USPC ...................... 257/77; 428/408, 698; 427/557
See application file for complete search history.

(56) References Cited

U.S. PATENT DOCUMENTS

| | | | | |
|---|---|---|---|---|
| 7,306,778 | B2 * | 12/2007 | Chaffin | 428/408 |
| 8,232,559 | B2 * | 7/2012 | West et al. | 257/77 |
| 8,497,513 | B2 * | 7/2013 | Kohn et al. | 257/77 |

OTHER PUBLICATIONS

Akedo, "Room Temperature Impact Consolidation (RTIC) of Fine Ceramic Powder by Aerosol Deposition Method and Applications to Microdevices" Journal of Thermal Spray Technology 17(2), 181-198 (2008).
Akedo et al., "Piezoelectric properties and poling effect of Pb(Zr, Ti)O3 thick films prepared for microactuators by aerosol deposition" Appl. Phys. Lett. 77(11), 1710-1712 (2000).
Akedo et al., "Microstructure and Electrical Properties of Lead Zirconate Titanate (Pb(Zr52/Ti48)O3) Thick Films Deposited by Aerosol Deposition Method" Jpn. J. Appl. Phys. 38, 5397-5401 (1999).
Lee et al., "Al2O3-nanodiamond composite coatings with high durability and hydrophobicity prepared by aerosol deposition" Surface & Coatings Technology 206, 4679-4684 (2012).
Kub et al., U.S. Appl. No. 13/899,444, filed May 21, 2013.
Office Action in U.S. Appl. No. 13/899,444, filed Jan. 27, 2015.

* cited by examiner

*Primary Examiner* — A. A. Turner
(74) *Attorney, Agent, or Firm* — US Naval Research Laboratory; Joseph T. Grunkemeyer

(57) ABSTRACT

A structure having: a substrate and a diamond layer on the substrate having diamond nanoparticles. The diamond nanoparticles are formed by colliding diamond particles with the substrate. A method of: directing an aerosol of submicron diamond particles toward a substrate, and forming on the substrate a diamond layer of diamond nanoparticles formed by the diamond particles colliding with the substrate.

23 Claims, 7 Drawing Sheets

DIAMOND AND DIAMOND COMPOSITE MATERIAL

This application claims the benefit of U.S. Provisional Application No. 61/649,693, filed on May 21, 2012. The provisional application and all other publications and patent documents referred to throughout this nonprovisional application are incorporated herein by reference.

TECHNICAL FIELD

The present disclosure is generally related to diamond films.

DESCRIPTION OF RELATED ART

The aerosol deposition method (ADM) is a film fabrication technique (Akedo et al., "Microstructure and Electrical Properties of Lead Zirconate Titanate ($Pb(Zr_{52}/Ti_{48})O_3$) Thick Films Deposited by Aerosol Deposition Method" Jpn. J. Appl. Phys. 38, Part 1, No. 9B, (1999) 5397-5401; Akedo et al., "Piezoelectric properties and poling effect of $Pb(Zr, Ti)O_3$ thick films prepared for microactuators by aerosol deposition" Appl. Phys. Lett. 77 (2000) 1710-1712) that utilizes an impact solidification phenomenon of ultra fine particles. In this method crystalline particles of submicron diameters are accelerated through a nozzle and fractured to a size of approximately 10-50 nm upon impact with the substrate. These ultra fine crystalline particles are thus bonded together by mechanochemical reactions. With the ADM, a film is formed by restructuring the ultra fine crystalline particles so that the crystalline structure of the raw powder is maintained in the process of the film fabrication. This enables fabrication of film that has the same crystalline structure as the raw powder. Aerosol deposition films are typically formed at room temperature, but additional annealing can be performed to improve the properties of the deposited films.

BRIEF SUMMARY

Disclosed herein is a structure comprising: a substrate and a diamond layer on the substrate comprising diamond nanoparticles. The diamond nanoparticles are formed by colliding diamond particles with the substrate.

Also disclosed herein is a method comprising: directing an aerosol comprising submicron diamond particles toward a substrate; and forming on the substrate a diamond layer comprising diamond nanoparticles formed by the diamond particles colliding with the substrate.

BRIEF DESCRIPTION OF THE DRAWINGS

A more complete appreciation of the invention will be readily obtained by reference to the following Description of the Example Embodiments and the accompanying drawings.

DETAILED DESCRIPTION OF EXAMPLE EMBODIMENTS

Figure 1:
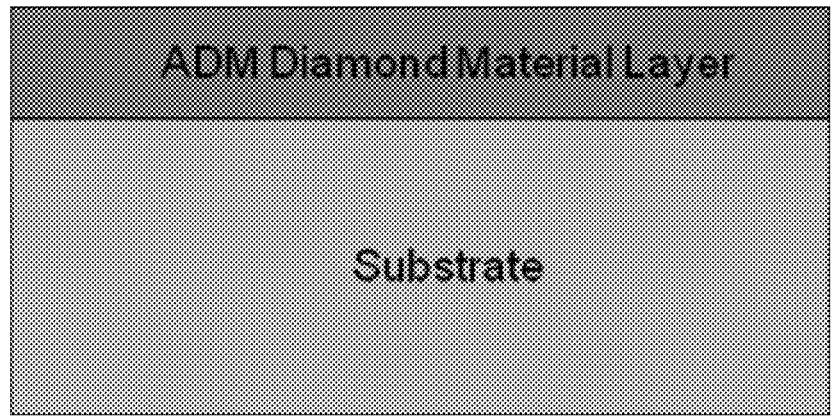
FIG. 1 shows an ADM diamond material layer on a substrate.

In the following description, for purposes of explanation and not limitation, specific details are set forth in order to provide a thorough understanding of the present disclosure. However, it will be apparent to one skilled in the art that the present subject matter may be practiced in other embodiments that depart from these specific details. In other instances, detailed descriptions of well-known methods and devices are omitted so as to not obscure the present disclosure with unnecessary detail.

ZnS and ZnSe are desirable materials for infrared windows but need a coating material deposited on the surface to protect the ZnS and ZnSe window material from rain damage or sand damage. Diamond is an attractive coating material on ZnS and ZnSe because diamond has good transmission in the infrared bands. A diamond coating on the ZnSe or ZnSe windows is desirable because the diamond coating may be resistant to rain impact or sand impact. Germanium is also an attractive material because it has good transmission in the infrared bands.

Disclosed herein is a method to make a diamond or a diamond composite material on a substrate material (structural material, mechanical material, substrate, semiconductor, insulator, infrared dome, or infrared window) using the aerosol deposition method. Also disclosed is a structure and method to make a diamond and a diamond composite material on an infrared window or infrared dome, with an optional interface material between the diamond or diamond composite material and the infrared window or infrared dome material. The diamond nanoceramic or polyceramic coating deposited on a material surface by aerosol deposition can provide a high temperature, high thermal conductivity coating on a material.

The diamond composite material may comprise, for example, a composite of diamond and germanium (Ge), diamond and zinc selenide (ZnSe), or diamond and zinc sulfide (ZnS). The composite may comprise nanocrystals or polycrystals of diamond with germanium nanocrystals or polycrystals, ZnSe nanocrystals or polycrystals, ZnS nanocrystals or polycrystals, or combinations of two or more of diamond, ZnSe, ZnS nanocrystals or polycrystals.

One potential advantage of the composite materials is that they may be transparent in both the mid-infrared and long-wavelengths. The composites can be used as coatings on ZnS or ZnSe domes or windows to provide mechanical protection. Another potential advantage of the composite materials is that the composite material can have a closer thermal expansion match to ZnS or ZnSe window or dome material then a diamond material coating alone. The composite coating on ZnS or ZnSe may have a closer thermal expansion coefficient than the diamond on ZnS or diamond on ZnSe material structure and thus may allow a wider temperature excursion without the composite coating material delaminating (or cracking within the composite material) from the ZnS or ZnSe dome or window. (Diamond thermal expansion coefficient is approximately $1 \times 10^{6}$ C.$^{-1}$, germanium thermal expansion coefficient is approximately $5.8 \times 10^{6}$ C.$^{-1}$, ZnS thermal expansion coefficient is approximately $6.3 \times 10^{6}$ C.$^{-1}$, and ZnSe thermal expansion coefficient is approximately $7.1 \times 10^{-6}$ C.$^{-1}$).

The ADM approach can deposit a coating material at low temperatures (such as at room temperature) on a material. Methods for low temperature deposition of coating material on ZnS or ZnSe are desirable because ZnS and ZnSe will degrade if a high temperature is used to deposit the coating material. For the case of diamond material layer for application to protection of infrared windows, the substrate will typically be ZnS or ZnSe substrate (window) materials.

Figure 2:
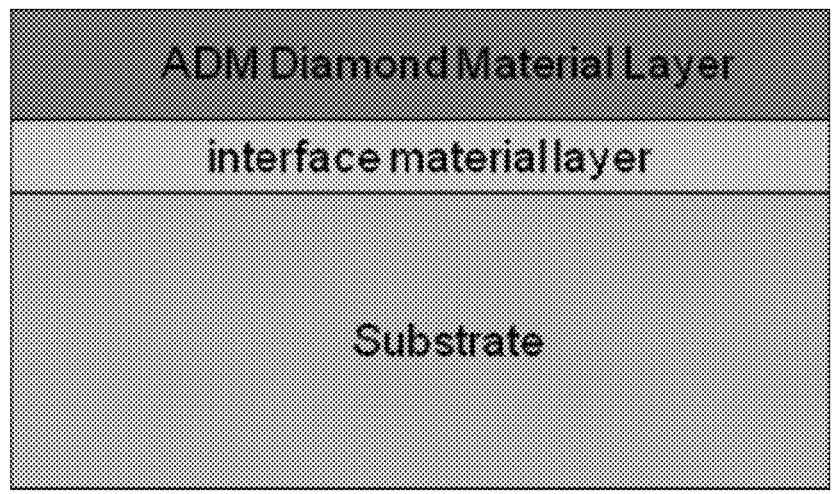
FIG. 2 shows an ADM diamond material layer on interface material layer on a substrate
Figure 3:
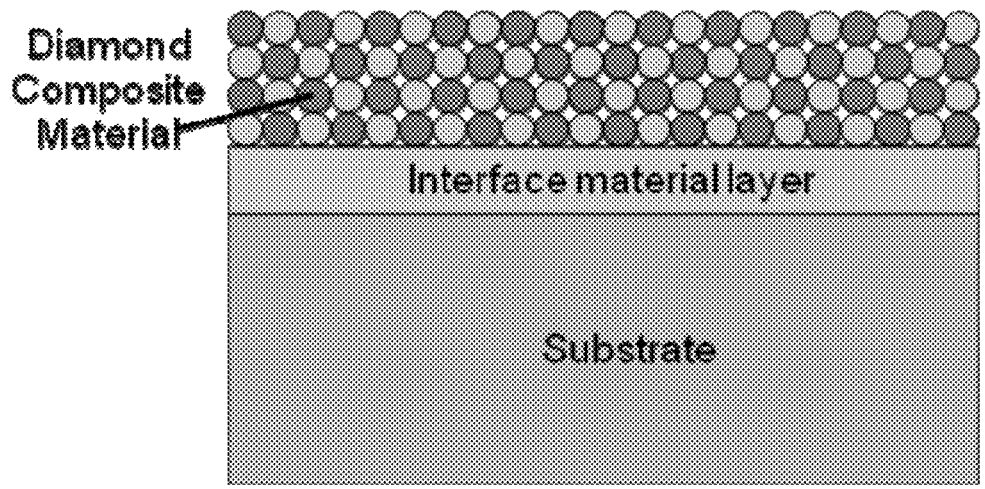
FIG. 3 shows an ADM diamond composite material layer on an interface material layer on a substrate.
Figure 4:
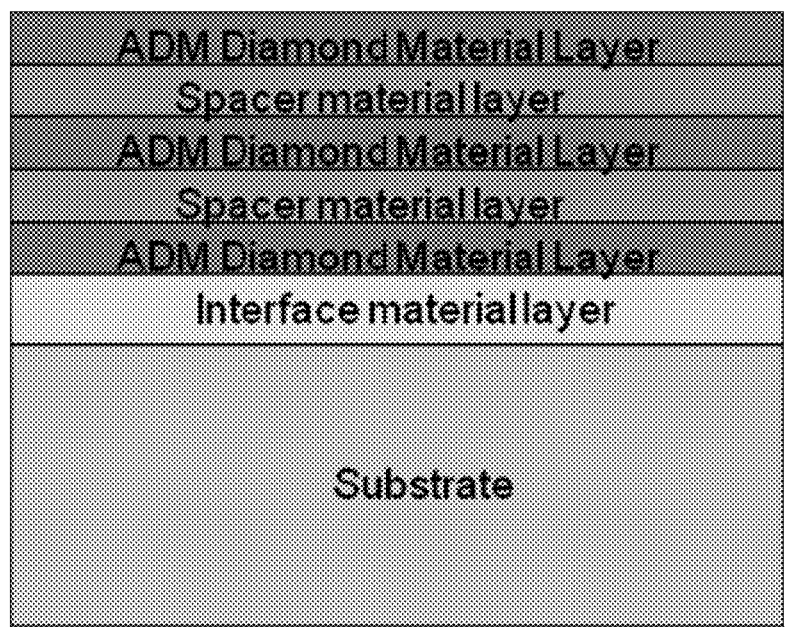
FIG. 4 shows an ADM stacked diamond/spacer material layer on an interface material layer on a substrate
Figure 5:
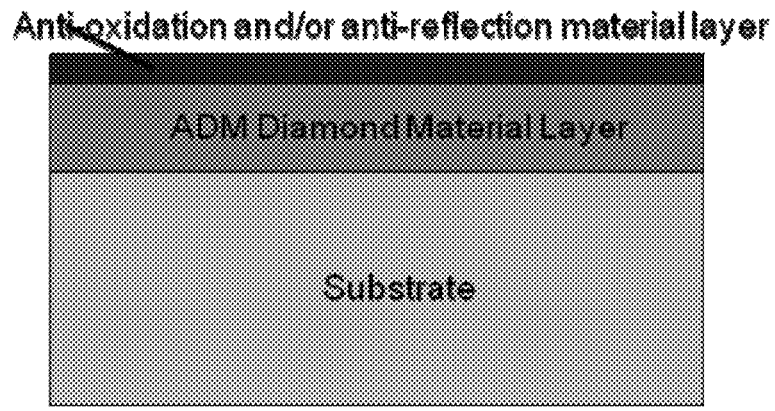
FIG. 5 shows an anti-oxidation and/or anti-reflection material layer on an ADM diamond material layer on a substrate.

Several variations in the method of making the structure may be used separately or in any combination. In the main method, an aerosol comprising submicron diamond particles is directed toward a substrate. A diamond layer comprising diamond nanoparticles is formed on the substrate, and is formed by the diamond particles colliding with the substrate as shown in FIG. 1. Optionally, an interface layer is deposited on the substrate before forming the diamond layer as shown in FIG. 2. The diamond layer may be a diamond composite layer when the aerosol comprises a second powder, as shown in FIG. 3 (also with an interface layer). The structure may also include a spacer layer on the diamond layer, optionally one or more sets of alternating diamond and spacer layers, and a final diamond layer as shown in FIG. 4 (also with an interface layer). An anti-oxidation or anti-reflective layer may also be deposited on the diamond layer as shown in FIG. 5 (also with an interface layer).

Example structures include, but are not limited to:
ADM is used to deposit a diamond material layer directly on a material (structural material, mechanical material, substrate, semiconductor, insulator, infrared dome, or infrared window).
ADM is used to deposit a diamond material layer an interface material layer on a material (structural material, mechanical material, substrate, semiconductor, insulator, infrared dome, or infrared window).
ADM is used to deposit a diamond composite material layer an interface material layer on a material (structural material, mechanical material, substrate, semiconductor, insulator, infrared dome, or infrared window).
ADM is used to deposit a stacked diamond/spacer material layer on a material (structural material, mechanical material, substrate, semiconductor, insulator, infrared dome, or infrared window).
ADM is used to deposit a stacked diamond/spacer material layer on an interface material layer a material (structural material, mechanical material, substrate, infrared dome, or infrared window).
ADM is used to deposit a graded diamond composite material layer on a material (structural material, mechanical material, substrate, semiconductor, insulator, infrared dome, or infrared window).
ADM is used to deposit a graded diamond composite material layer on an interface material layer on a material (structural material, mechanical material, substrate, semiconductor, insulator, infrared dome, or infrared window).

The diamond material layer that is deposited by ADM is typically a nanocrystalline diamond material layer. The typical operation for the ADM method is that approximately 0.5 micron size particles are directed with a velocity of approximately 250 m/s toward a substrate. The particles impact with the substrate and fracture into nanocrystals with a size of approximately 10-50 nm. These ultra fine diamond crystalline particles are thus bonded together by mechanochemical reactions. Aerosol deposition films may be formed at room temperature, but additional annealing can be performed to improve the properties of the deposited films. The diamond material layer ADM deposition temperature preferably at room temperature but can be at a cryogenic temperature or above room temperature. For the case of diamond deposition on ZnS, the deposition temperature may be less than 450° C. or less than 100° C.

Figure 6:
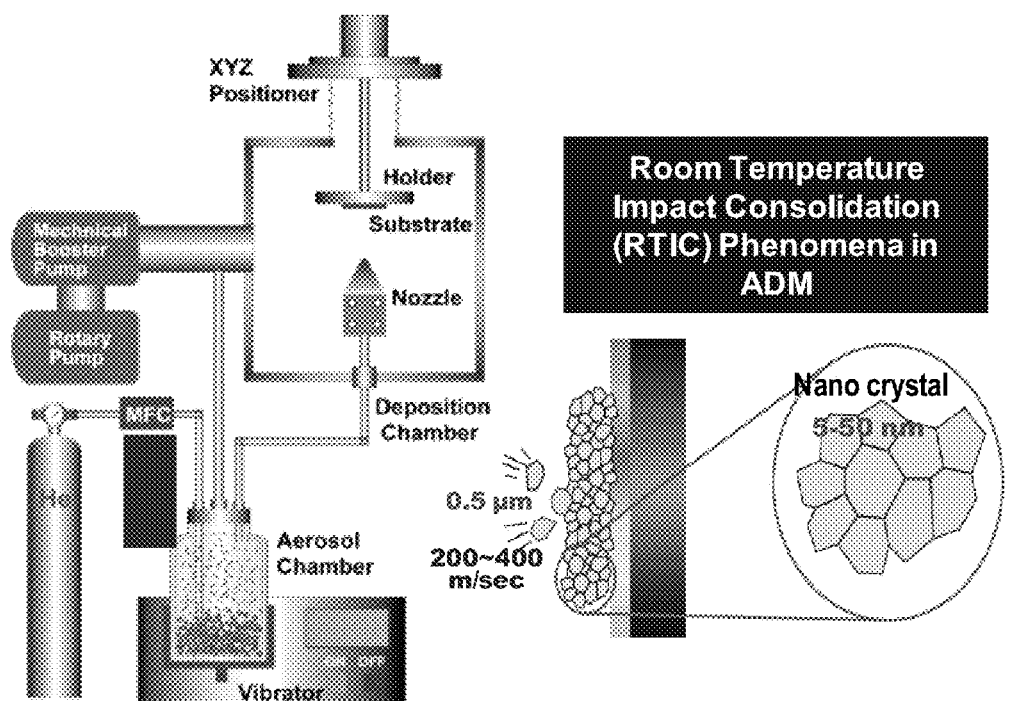
FIG. 6 schematically illustrates the ADM apparatus.

FIG. 6 schematically illustrates the ADM apparatus. A source of gas such a tank of gas or other source of gas is connected to a first chamber (or aerosol chamber) with a gas flow control means used to control the flow of gas between the source of gas and the first chamber. In this process, a powder (or particles) of selected size or size distribution is aerosolized and preferably deagglomerated either within the first chamber or external to the first chamber. The ambient within the first chamber generally comprises flowing nitrogen, helium, argon, or oxygen or a combination of gases, with the gas or gas combination within the first chamber being at a first selected pressure or a selected variable pressure schedule. The first chamber is connected with at least an air flow connection between the first chamber and with a second chamber (or deposition chamber) with the second chamber having an ambient or vacuum with a selected pressure that is lower than the selected pressure within the first chamber. The air flow connection between the first chamber and the second chamber can contain a nozzle of selected dimension that confines the air flow between the first chamber and the second chamber to a smaller dimension then the dimension of the air flow connection. Because of the pressure of gas in the first chamber is at a higher pressure then the pressure of gas in the second chamber, the first chamber injects gas into a second chamber. The second chamber contains a target substrate. The second chamber is connected to a pump and is generally pumped to less than 1 Torr vacuum by the pump. The pressure differential accelerates the aerosolized particles through a nozzle toward the substrate, normal to the surface of the substrate or at an angle relative to the substrate. The ADM can form thick (>100 µm), dense (95% bulk density) films of ceramic or metallic compounds onto a variety of substrates.

An interface material layer can act as a material layer that facilitates the large difference in thermal expansion coefficient between the diamond material layer and the substrate material. The interface material layer can also act as material layer that can be impacted by the high velocity particles without damaging the substrate material. The interface material layer can be a polymer, adhesive, amorphous material, polycrystalline material, highly oriented material, infrared transparent material, semiconductor, dielectric, soft material layer, material layer that has the property of yielding when stressed or strained, or a low modulus material. Examples of interface materials are amorphous germanium, polycrystalline germanium, highly ordered germanium, polymer, and other materials known to those skilled in the art.

A diamond composite material that is formed by ADM can comprise a diamond-germanium composite material, a diamond-ZnS, a diamond-ZnSe material, diamond-dielectric material, or diamond-semiconductor material known to those skilled in the art. An approach for forming diamond composite material using ADM is to mix diamond powders and geranium powders and an ultrasonic agitator or other way to get a good mixture of diamond and germanium particles. The mixture of diamond and germanium particles is next loaded into the aerosol generation portion of the ADM tool. The mixture of diamond and germanium particles are made to go into the ambient and then the differential pressure directs the mixture of diamond and germanium particles to a substrate.

The diamond powders and geranium powders may be also mixed in an ultrasonic agitator or other apparatus to get a good mixture of diamond and germanium particles. The mixture of diamond and germanium particles is next loaded into the aerosol generation portion of the ADM tool. The mixture of diamond and germanium particles are made to go into the ambient and then the differential pressure directs the mixture of diamond and germanium particles to a substrate.

A graded diamond composite material or stepped diamond composite material or laminated composite material layer that is formed by ADM can comprise a diamond-germanium composite material, a diamond-ZnS, a diamond-ZnSe material, diamond-dielectric material, or diamond-semiconductor material with a variation in the percentage of diamond in the composite material layer as a function of depth. An approach for forming diamond composite material using ADM is to have two nozzles with one nozzle directing diamond particles to the substrate and a second nozzle directing germanium or ZnSe particles toward the substrate. The nozzles can alternately deposit a diamond material and then deposit a germanium layer (or ZnSe layer) to form a laminated material layer.

The spacer material layer can be selected to help accommodate difference in the thermal expansion coefficient between diamond and the substrate material (structural material, mechanical material, substrate, semiconductor, insulator, infrared dome, or infrared window) without diamond material or spacer material delamination from the substrate, or without the diamond material layer, the spacer material layer, or the material cracking due to stress or strain in the material. For infrared window applications, a spacer material layer may comprise germanium, ZnSe, or other material that is transparent in the infrared wavelengths. For mechanical applications, the spacer material layer can be a metal, semiconductor, insulator, dielectric, amorphous, or polycrystalline. The spacer material layer can be deposited, by example, by ADM, sputtering, physical vapor deposition, CVD, PECVD, MOCVD, ALD, ALE, or other method known to those skilled in the art.

Another aspect is an AlN coating made by sputtering, physical vapor deposition, atomic layer deposition, atomic layer epitaxy, MBE, or MOCVD on the diamond surface to provide oxidation resistance layer for the diamond material or diamond-composite material to act as an anti-reflecting coating on the diamond material.

In one embodiment a diamond material layer is deposited directly on a substrate. For this embodiment, the aerosol deposited diamond material layer is formed directly on a substrate material. The substrate material can be a structural material, mechanical material, substrate, semiconductor, insulator, infrared dome, or infrared window material. The diamond material layer can be a hard, high thermal conductivity coating for the case of the diamond used as a protective coating on a ZnS or ZnSe infrared window or infrared dome material. The diamond powder that is loaded into the aerosol generation portion of the aerosol deposition method system can be selected to facilitate the fracture of diamond powders when the diamond powder impacts a material. For example, the diamond powder can be selected to have irregular shape rather than an approximately spherical shape to facilitate the fracture of the diamond powder when the powder impacts the material. The diamond powder can be selected to have a dimension of approximately 500 nm or larger. One of the reasons for selecting a powder of approximately 500 nm or larger is that there will be less of a tendency for the diamond powder to stick to each other in the aerosol generation portion of the ADM system. The aerosol deposit method is similar to that described by Akedo, "Room Temperature Impact Consolidation (RTIC) of Fine Ceramic Powder by Aerosol Deposition Method and Applications to Microdevices" J. Thermal Spray Technol., 17(2), 181-198 (2008), except that a diamond powder is used for the ADM and the diamond powder can be selected to have enhanced fracturing by selecting a diamond powder with an irregular shape. The substrate material will typically be at room temperature during the deposition of the diamond material layer. The diamond material layer thickness will depend on the application and may be in the range of 0.5 micron to 200 microns thick.

In another embodiment a diamond material layer is deposited on interface material on a substrate. For this embodiment, an interface material layer is first deposited on a substrate material. The substrate material can be a structural material, mechanical material, substrate, semiconductor, insulator, infrared dome, or infrared window material. The interface material layer can act as material layer that can be impacted by the high velocity particles without damaging the substrate material. The interface material layer can be a polymer, adhesive, amorphous material, polycrystalline material, highly oriented material, infrared transparent material, semiconductor, dielectric, soft material layer, material layer that has the property of yielding when stressed or strained, or a low modulus material. Examples of candidate interface material are amorphous germanium, polycrystalline germanium, highly ordered germanium, polymer, and other material known to those skilled in the art. The interface material layer can be annealed at a selected temperature to improve its properties prior to the deposition of the diamond material layer. An anneal at 600° C. or greater will typically grow the size of the nanocrystals in the nanoceramic material and also reduce the porosity of the interface material layer. The diamond material layer can be a hard, high thermal conductivity coating on a material for the case of the diamond used as a protective coating on a ZnS or ZnSe infrared window or infrared dome material. The diamond powder that is loaded into the aerosol generation portion of the aerosol deposition method system can be selected to facilitate the fracture of diamond powders when the diamond powder impacts a material. For example, the diamond powder can be selected to have irregular shape rather than an approximately spherical shape to facilitate the fracture of the diamond powder when the powder impacts the material. The diamond powder can be selected to have a dimension of approximately 500 nm or larger. One of the reasons for selecting a powder of approximately 500 nm or larger is that there will be less of a tendency for the diamond powder to stick to each other in the aerosol generation portion of the ADM system. The aerosol deposit method is similar to that described by Akedo, "Room Temperature Impact Consolidation (RTIC) of Fine Ceramic Powder by Aerosol Deposition Method and Applications to Microdevices" J. Thermal Spray Technol., 17(2), 181-198 (2008), except that a diamond powder will be used for the ADM and the diamond powder can be selected to have enhanced fracturing by selecting a diamond powder with an irregular shape. The material (structural material, mechanical material, substrate, semiconductor, insulator, infrared dome, or infrared window) will typically be at room temperature during the deposition of the diamond material layer on a material by the ADM. The diamond material layer thickness will depend on the application be can be in the range of 0.5 micron to 200 microns thick.

In another embodiment a diamond composite material layer is deposited on a substrate. For this embodiment, multiple powder types are present in the aerosol generation portion of the ADM system. The powders can be premixed or can be mixed within the generation portion of the ADM system. The diamond-composite material that is formed by ADM can comprise a diamond-germanium composite material, a diamond-ZnS, a diamond-ZnSe material, diamond-dielectric material, or diamond-semiconductor material known to those skilled in the art. An approach for forming diamond composite material using ADM is to mix diamond powders and geranium powders and an ultrasonic agitator or other way to get a good mixture of diamond and germanium particles. The mixture of diamond and germanium particles is next loaded into the aerosol generation portion of the ADM tool. The mixture of diamond and germanium particles are made to go into the ambient and then the differential pressure directs the mixture of diamond and germanium particles to a substrate. The aerosol deposited diamond composite material layer would be formed directly on a substrate material. The material can be a structural material, mechanical material, substrate, semiconductor, insulator, infrared dome, or infrared window material. The diamond material layer can be a hard, high thermal conductivity coating for the case of the diamond used as a protective coating on a ZnS or ZnSe infrared window or infrared dome material. The diamond powder that is loaded into the aerosol generation portion of the aerosol deposition method system can be selected to facilitate the fracture of diamond powders when the diamond powder impacts a material. For example, the diamond powder can be selected to have irregular shape rather than an approximately spherical shape to facilitate the fracture of the diamond powder when the powder impacts the material. The diamond powder can be selected to have a dimension of approximately 500 nm or larger. One of the reasons for selecting a powder of approximately 500 nm or larger is that there will be less of a tendency for the diamond powder to stick to each other in the aerosol generation portion of the ADM system. The aerosol deposit method is similar to that described by Akedo, "Room Temperature Impact Consolidation (RTIC) of Fine Ceramic Powder by Aerosol Deposition Method and Applications to Microdevices" J. Thermal Spray Technol., 17(2), 181-198 (2008), except that a diamond powder is used for the ADM and the diamond powder can be selected to have enhanced fracturing by selecting a diamond powder with an irregular shape. The material (structural material, mechanical material, substrate, semiconductor, insulator, infrared dome, or infrared window) will typically be at room temperature during the deposition of the diamond material layer on a material by the ADM. The diamond material layer thickness will depend on the application be can be in the range of 0.5 micron to 200 microns thick.

The following example is given to illustrate specific applications. These specific examples are not intended to limit the scope of the disclosure in this application.

Example

ZnS/Diamond (Z/D) Composite Layers

Figure 7:
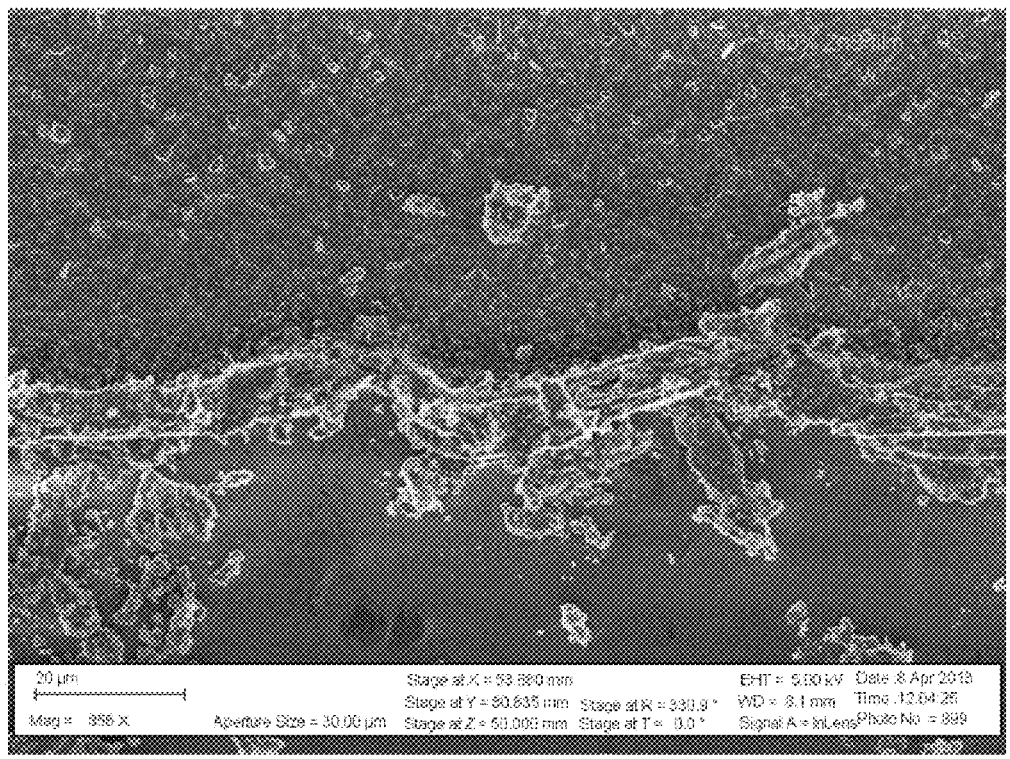
FIG. 7 shows an SEM image of the surface of 60% Z/D film at the film edge. Thickness is 0.2 µm. The bottom of the image is exposed sapphire. The top is the Z/D composite film. Scale is 20 µm.
Figure 8:
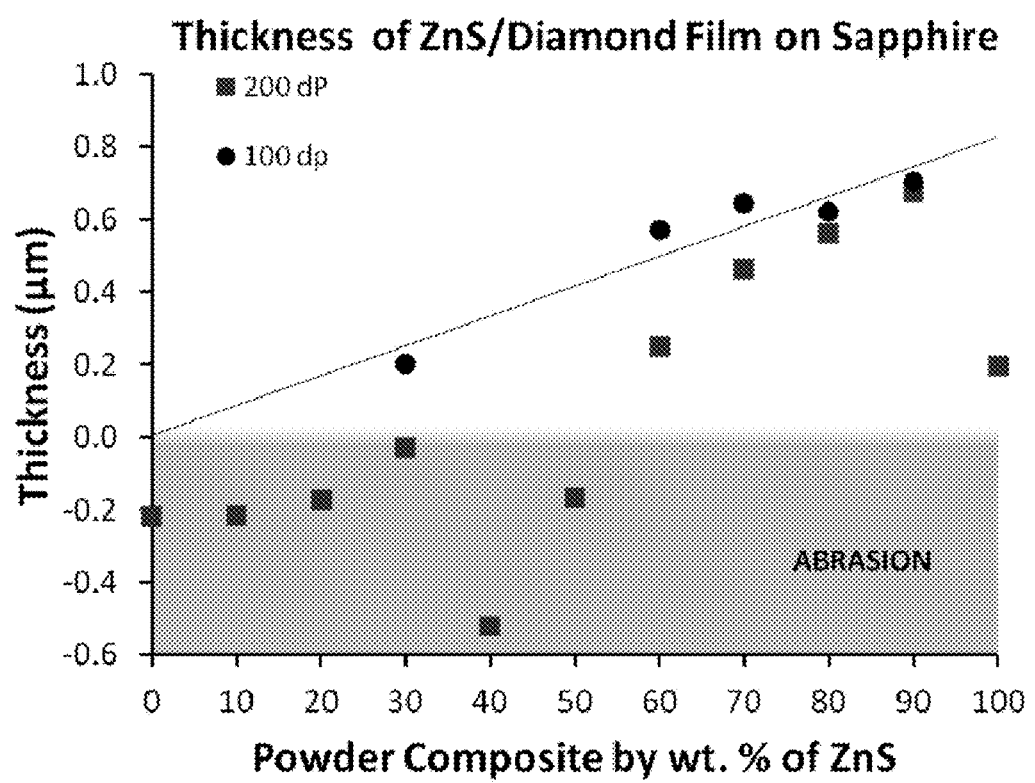
FIG. 8 shows a profile of a Z/D composite coating on sapphire. Legend is differential pressure (dP). As the wt. % of ZnS increases the film profile transitions from abrasion (grey region) to formation. Lowering the kinetic energy reduces the abrasion. The line fit is to the 100 dP data.

Initial depositions of Z/D composites were made on sapphire, Si, and ZnS substrates. FIG. 7 is a representative scanning electron microscopy (SEM) image of the edge of a 60% wt. ZnS Z/D film on sapphire. The film was well compacted and continuous. Fragments of diamond and ZnS could be found on the film surface and particles within the film were fractured and well adhered. FIG. 8 shows results of deposition onto sapphire which, for a pressure differential of 200 Torr, have a linear trend from sputter erosion of the substrate to formation of a film with increasing fractions of ZnS. The crossover from abrasion to film formation occurs between 50-60% ZnS and a mixture of 90% ZnS and 10% diamond forms a well-adhered film of about 0.7 microns thickness at a rate of 0.14 microns/min. A similar trend occurs for deposition onto Si, but initial efforts resulted in abrasion of ZnS substrates with only a sparsely embedded diamond anchor layer possibly due to the lack of plasticity at the micrometer scale that can be seen in SEM images on both sapphire and Si.

Figure 9:
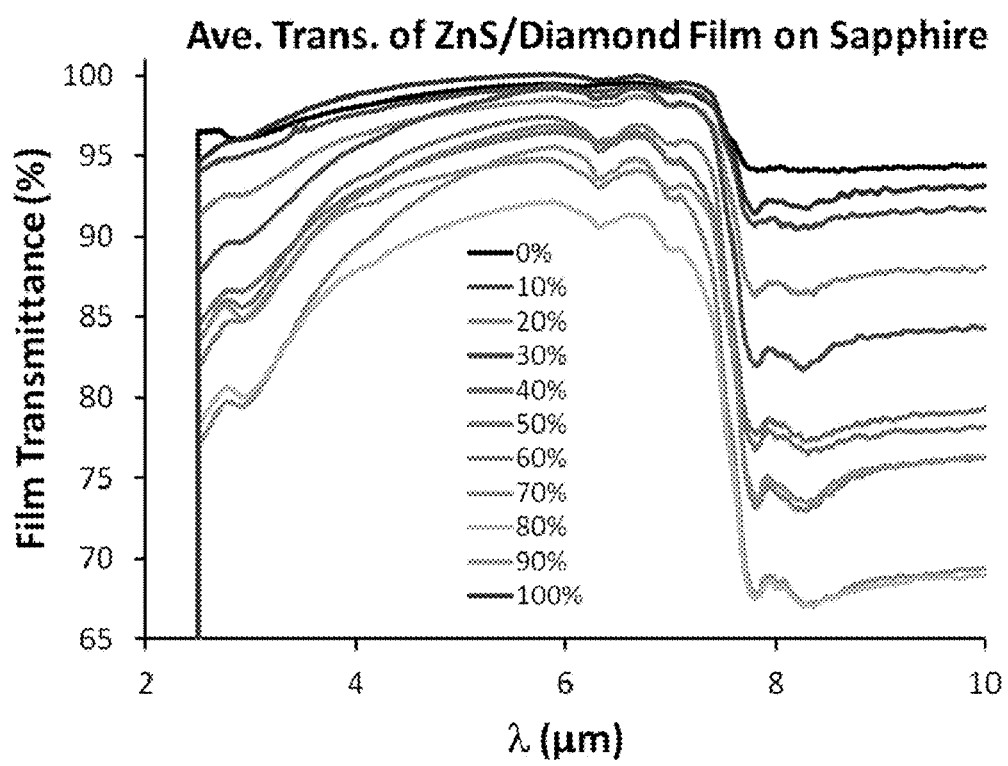
FIG. 9 shows the average transmittance of Z/D films shown by wt. % of ZnS. The cut-off wavelength for the sapphire substrate occurs around 7 µm indicated by the sharp drop. The rounding below 6 µm is due to an absorption band in diamond.
Figure 10:
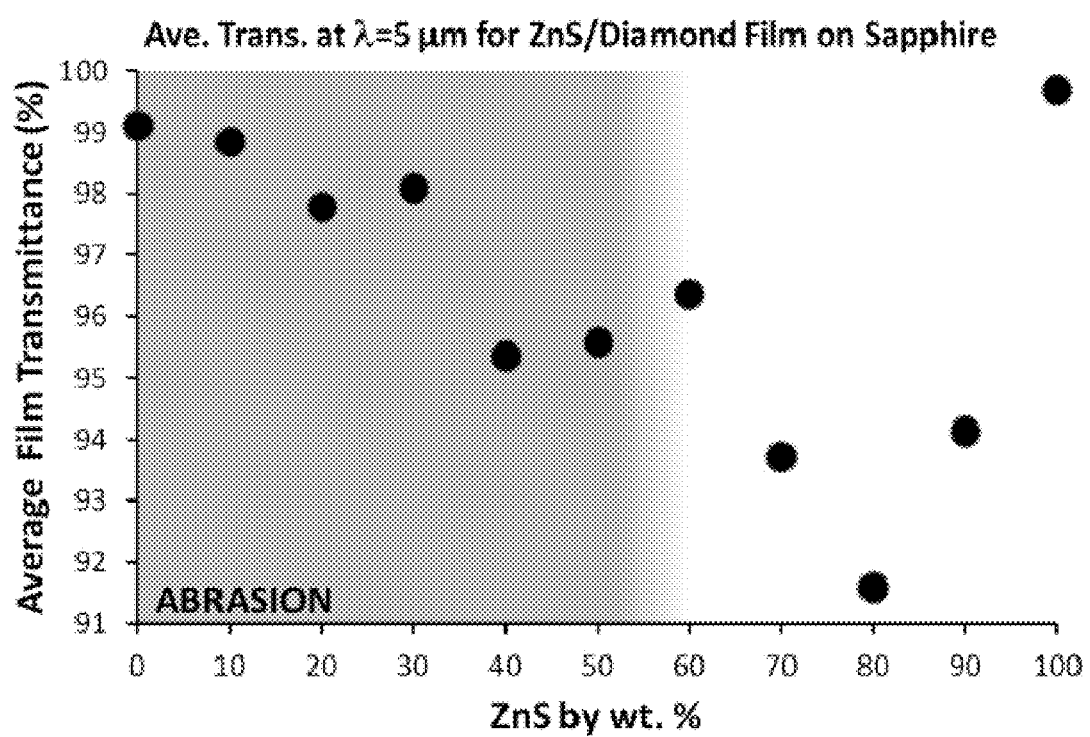
FIG. 10 shows the transmittance of Z/D film at $\lambda=5$ µm vs. wt. % of ZnS. These data represent the trend within a diamond absorption band. The shaded region corresponds to abrasion.

Averaged infrared transmission measurements across regions on the film are shown in FIG. 9. The sharp drop at about 7 μm is the characteristic absorption of sapphire. All mixtures measured had a transparency above 80% in the range of 3-7 μm. FIG. 10 shows the relation between abrasion, percent mixture, and transmittance of the films at 5 μm which is located within a minor diamond absorption band. Above 50% ZnS the transmittance is decreasing with increasing film thickness. Since the thickness is not sufficient to account for increased absorption the trend is likely due to an increase in diamond content in the film, i.e., even though there is less diamond by percent there is more of it in the film. The crossover from abrasion to film formation may be due to local plasticity, grain dislocations, defects, electrostatic, and/or chemical properties of the constituent materials.

Obviously, many modifications and variations are possible in light of the above teachings. It is therefore to be understood that the claimed subject matter may be practiced otherwise than as specifically described. Any reference to claim elements in the singular, e.g., using the articles "a," "an," "the," or "said" is not construed as limiting the element to the singular.

What is claimed is:
1. A structure comprising:
a substrate; and
a diamond layer on the substrate comprising diamond nanoparticles;
wherein the diamond nanoparticles are formed by colliding diamond particles with the substrate.
2. The structure of claim 1, wherein the substrate comprises ZnS, ZnSe, a semiconductor, an insulator, or an infrared window.
3. The structure of claim 1, wherein the diamond nanoparticles are 10-50 nm in size.
4. The structure of claim 1, wherein the diamond nanoparticles are bonded together by mechanochemical reactions.
5. The structure of claim 1, wherein the diamond layer is a diamond composite layer.
6. The structure of claim 5, wherein the diamond composite layer comprises germanium, ZnS, ZnSe, a dielectric, or a semiconductor.
7. The structure of claim 5, wherein the percentage of diamond in the diamond composite layer varies with the depth within the diamond composite layer.
8. The structure of claim 1, wherein the structure comprises:
a plurality of the diamond layers; and
a spacer layer between each adjacent pair of the diamond layers.
9. The structure of claim 8, wherein the spacer layers comprise germanium, ZnSe, an infrared transparent material, a metal, a semiconductor, an insulator, a dielectric, an amorphous material, or a polycrystalline material.

10. The structure of claim 1, wherein the structure further comprises:
   an interface layer between the diamond layer and the substrate.

11. The structure of claim 10, wherein the interface layer comprises a polymer, an adhesive, an amorphous material, a polycrystalline material, a highly oriented material, an infrared transparent material, a semiconductor, or a dielectric.

12. The structure of claim 1, wherein the structure further comprises:
   an anti-oxidation or anti-reflective layer on the diamond layer.

13. The structure of claim 12, wherein the anti-oxidation or anti-reflective layer comprises AlN.

14. A method comprising:
   directing an aerosol comprising submicron diamond particles toward a substrate; and
   forming on the substrate a diamond layer comprising diamond nanoparticles formed by the diamond particles colliding with the substrate.

15. The method of claim 14, wherein the diamond layer is formed at less than 450° C.

16. The method of claim 14, wherein the diamond layer is formed at room temperature.

17. The method of claim 14, wherein the diamond particles are directed toward the substrate at about 250 m/s.

18. The method of claim 14, wherein the aerosol further comprises a second powder.

19. The method of claim 18, wherein the percent of diamond particles in the aerosol is varied with the depth of the diamond composite layer.

20. The method of claim 14, further comprising:
   depositing a spacer layer on the diamond layer;
   optionally repeating forming the diamond layer and depositing the spacer layer one or more times; and
   depositing a final diamond layer.

21. The method of claim 14, further comprising:
   depositing an interface layer on the substrate before forming the diamond layer.

22. The method of claim 14, further comprising:
   depositing an anti-oxidation or anti-reflective layer on the diamond layer.

23. The method of claim 14, further comprising:
   annealing the diamond layer.

\* \* \* \* \*